United States Patent
Kanao

(10) Patent No.: US 9,235,135 B2
(45) Date of Patent: Jan. 12, 2016

(54) EXPOSURE APPARATUS

(75) Inventor: Masayasu Kanao, Yokohama (JP)

(73) Assignee: V TECHNOLOGY CO., LTD., Yokohama-Shi, Kanagawa (JP)

( * ) Notice: Subject to any disclaimer, the term of this patent is extended or adjusted under 35 U.S.C. 154(b) by 346 days.

(21) Appl. No.: 13/883,751

(22) PCT Filed: Oct. 24, 2011

(86) PCT No.: PCT/JP2011/074454
§ 371 (c)(1),
(2), (4) Date: May 6, 2013

(87) PCT Pub. No.: WO2012/063631
PCT Pub. Date: May 18, 2012

(65) Prior Publication Data
US 2013/0235362 A1 Sep. 12, 2013

(30) Foreign Application Priority Data
Nov. 8, 2010 (JP) .................................. 2010-250104

(51) Int. Cl.
*G01B 11/00* (2006.01)
*G01N 21/86* (2006.01)
(Continued)

(52) U.S. Cl.
CPC .......... *G03F 7/70141* (2013.01); *G02F 1/1303* (2013.01); *G02F 1/133528* (2013.01);
(Continued)

(58) Field of Classification Search
CPC . G02F 1/1303; G02F 1/133528; G03B 27/10; G03F 7/20; G03F 7/70141; G03F 7/70683; G03F 7/70775; G03F 7/70791; G03F 9/00; G03F 9/70; G03F 9/7003; G03F 9/7007; G03F 9/7076; G03F 9/708; G03F 9/7084

USPC ............. 250/548, 559.01; 310/12.19; 355/67, 355/68, 72, 77; 356/399–401, 614–616
See application file for complete search history.

(56) References Cited

U.S. PATENT DOCUMENTS

2003/0190071 A1 10/2003 Ganot et al.
2005/0225788 A1 10/2005 Katayama et al.
(Continued)

FOREIGN PATENT DOCUMENTS

JP 01-295261 A 11/1989
JP 05-323621 A 12/1993
(Continued)

OTHER PUBLICATIONS

International Search Report in PCT/JP2011/074454 dated Nov. 22, 2011(English Translation Thereof).
United States Office Action dated Apr. 8, 2014, in U.S. Appl. No. 13/884,192.
United States Notice of Allowance dated Jul. 16, 2014, in U.S. Appl. No. 13/884,192.

*Primary Examiner* — Colin Kreutzer
(74) *Attorney, Agent, or Firm* — McGinn IP Law Group, PLLC

(57) ABSTRACT

An exposure apparatus includes a first mark-forming unit further upstream than an irradiation region for exposure light in a direction of conveyance of a member to be exposed. A mark for meandering detection is detected, and a detection unit detects the mark for meandering detection in a direction intersecting a direction of movement of the member to be exposed. A second mark-forming unit is moved so as to negate an amount of meandering by the member to be exposed, computed on the basis thereof, and an alignment mark is formed rectilinearly in a relative fashion with respect to the member to be exposed. This enables highly accurate, stable exposure whereby, even in a case where the member is supplied continuously, an alignment mark for mask position adjustment can be changed in accordance with the meandering of the member to be exposed and the position of the mask with respect to the member to be exposed can be accurately adjusted.

10 Claims, 12 Drawing Sheets

(51) Int. Cl.
  *G03B 27/32* (2006.01)
  *G03B 27/58* (2006.01)
  *G03B 27/74* (2006.01)
  *H02K 41/02* (2006.01)
  *G03F 7/20* (2006.01)
  *G02F 1/13* (2006.01)
  *G02F 1/1335* (2006.01)
  *G03B 27/10* (2006.01)
  *G03F 9/00* (2006.01)

(52) U.S. Cl.
  CPC  *G03B27/10* (2013.01); *G03F 7/20* (2013.01); *G03F 7/70775* (2013.01); *G03F 7/70791* (2013.01); *G03F 9/00* (2013.01); *G03F 9/7003* (2013.01)

(56) References Cited

U.S. PATENT DOCUMENTS

| | | |
|---|---|---|
| 2009/0059195 A1 | 3/2009 | Sato et al. |
| 2013/0235362 A1 | 9/2013 | Kanao |

FOREIGN PATENT DOCUMENTS

| | | |
|---|---|---|
| JP | 08-301495 A | 11/1996 |
| JP | 2001-060008 A | 3/2001 |
| JP | 2005-316411 A | 11/2005 |
| JP | 2007-310209 A | 11/2007 |
| JP | 2009-53383 A | 3/2009 |
| JP | 2009-216861 A | 9/2009 |
| JP | 2009-276522 A | 11/2009 |

FIG. 3
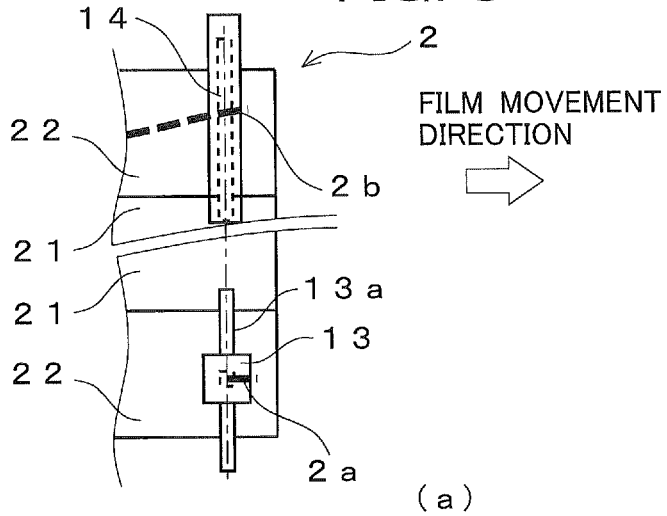
(a)
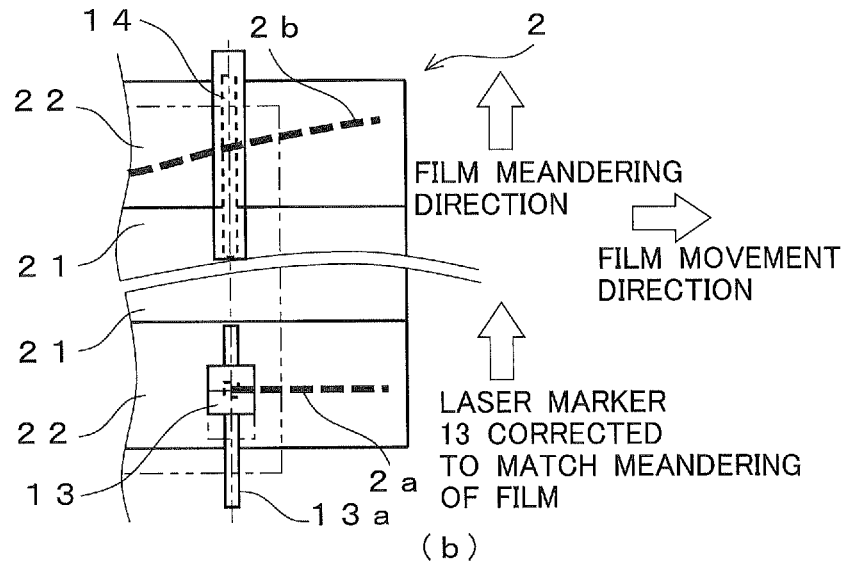
(b)
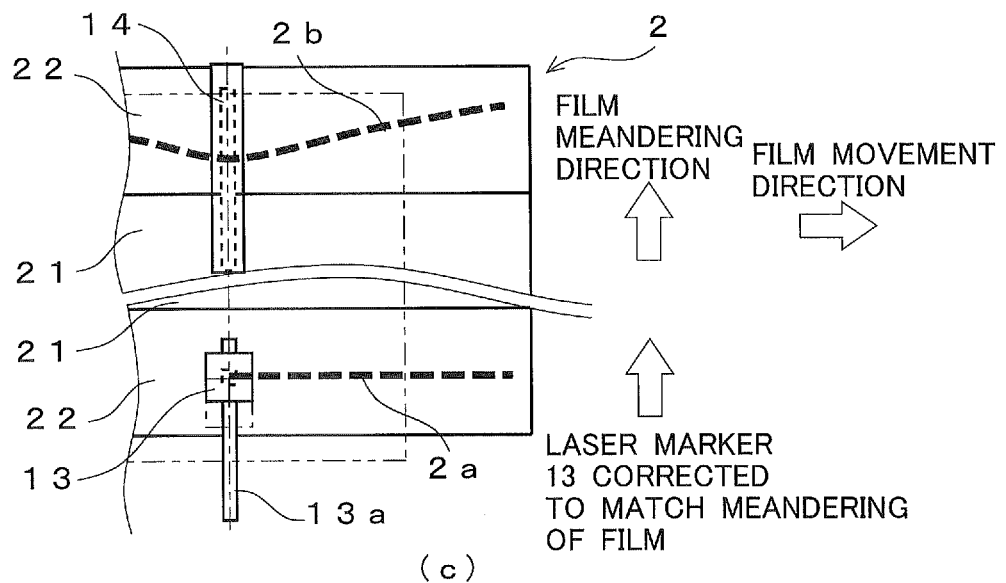
(c)

FIG. 4
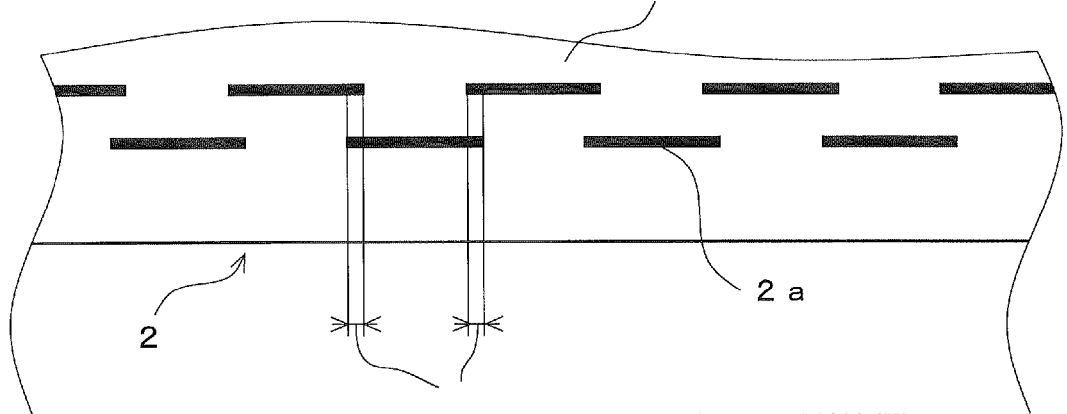
TWO ROWS ARRANGED IN STAGGERED MANNER
SO THAT LEADING END
AND TRAILING END OVERLAP WITH EACH OTHER
(a)
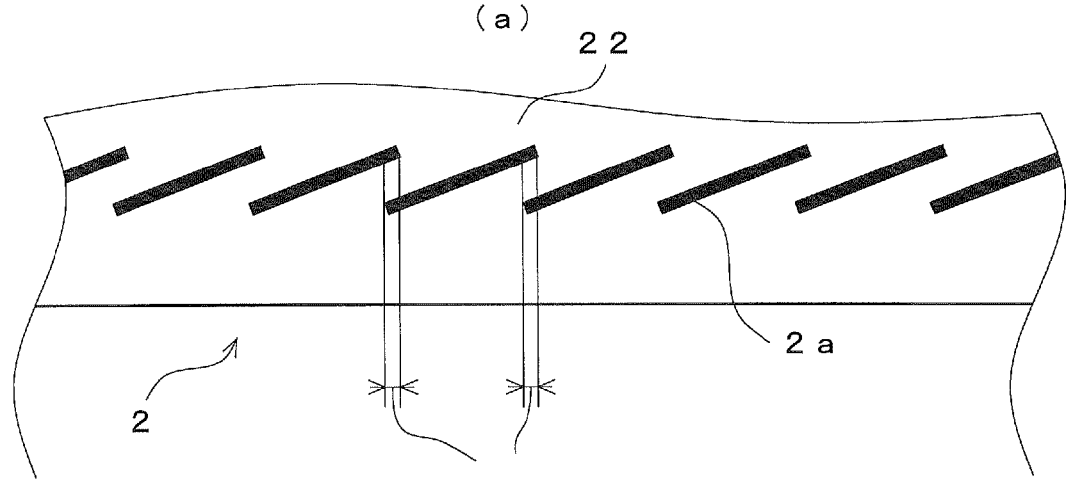
ARRANGED AT AN INCLINE WITH RESPECT
TO FILM MOVEMENT DIRECTION
SO THAT LEADING END AND TRAILING END
OVERLAP WITH EACH OTHER
(b)
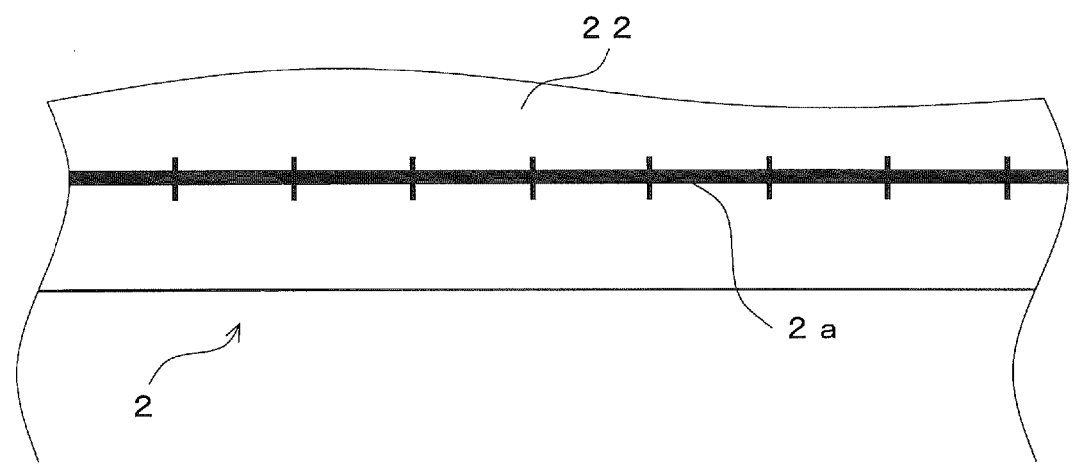
(c)

MEANDERING IN FILM WIDTH DIRECTION FROM AFTER THE LEADING END PASSES THROUGH LINE CCD UNTIL WHEN FINAL END PASSES THROUGH LINE CCD DETECTED FOR EVERY MEANDERING-DETECTION MARK

PRIOR ART

PRIOR ART

FIG. 13
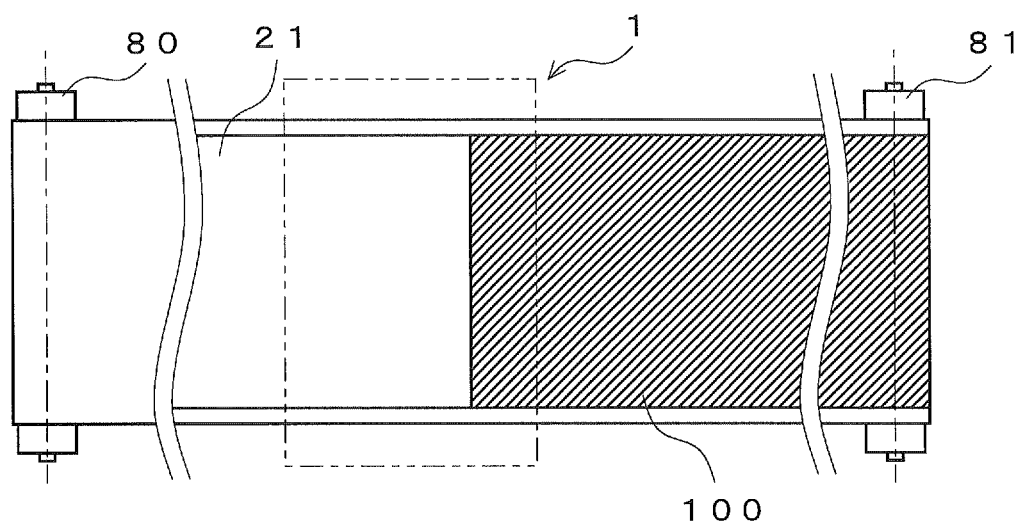
(a)
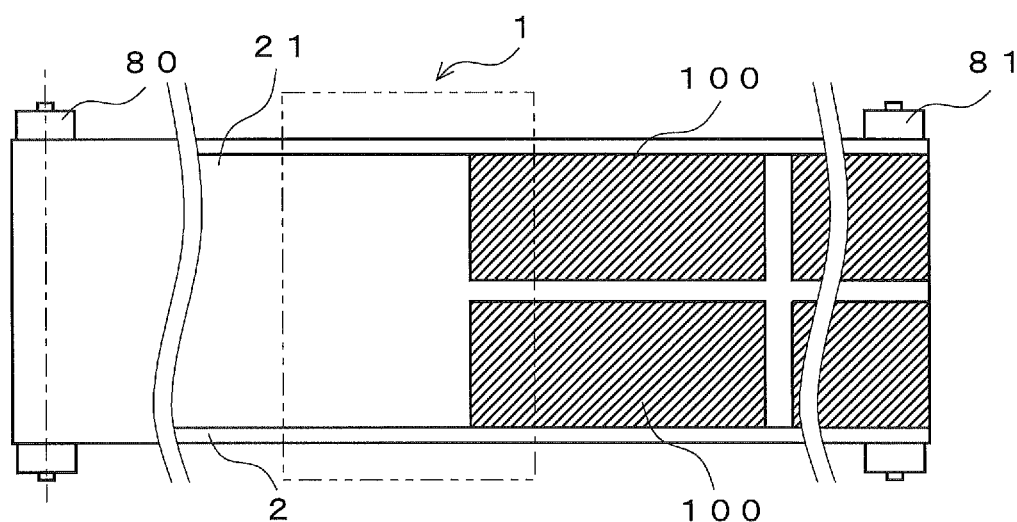

EXPOSURE APPARATUS

TECHNICAL FIELD

The present invention relates to an exposure apparatus having heightened exposure accuracy in exposing a member to be exposed being conveyed in a continuous fashion; in particular, the present invention relates to an exposure apparatus that enables stable exposure whereby, even in a case where the member to be exposed meanders in a direction perpendicular to a movement direction, an alignment mark for mask position adjustment can be changed in accordance with the meandering of the member to be exposed and the position of a mask with respect to the member to be exposed can be accurately adjusted.

BACKGROUND ART

Conventionally, in a case where, for example, an oriented coating or the like is formed on a glass substrate such as a liquid crystal display, one practice has been to supply the glass substrate, on the surface of which a coating such as an oriented coating has been formed, to an exposure apparatus and to expose and thereby optically orient the oriented coating in a predetermined direction.

Such an exposure apparatus irradiates with an exposure light emitted from an exposure light source via a predetermined optical system, after the exposure light has been transmitted through a pattern of a light transmission region of a mask; the glass substrate to be exposed is placed on, for example, a movable stage, and the stage is moved to thereby convey the glass substrate to a region of irradiation with exposure light. Then, the practice has been to form a predetermined exposure region on the glass substrate by exposing the coating formed on the glass substrate, in correspondence with the pattern of the mask.

Thus, with a member to be exposed such as a glass substrate that is conveyed by a conveying apparatus such as a stage, the formation region of the oriented coating or the like is considerably affected by the positional accuracy of a conveying apparatus, the mask, and the like. As such, there has been proposed a variety of techniques for higher accuracy in exposing a predetermined region of a member to be exposed.

For example, Patent Document 1 discloses an apparatus for exposing a film; a pair of rectangular markings are added to two sides of the film, at film side parts on the outside of a region to be exposed. Then, the position of the mask is adjusted so that a predetermined region of the film is irradiated with the exposure light, by optically detecting the shape of the markings for alignment in a movement direction of the film as well as a direction perpendicular to the movement direction in a state where the conveyance of the film has been stopped.

The member to be exposed may be a film, in which case, for example, a pair of rollers 80, 81 as are illustrated in FIGS. 9 and 10 is used as a conveying apparatus for continuously conveying the film to the exposure apparatus. That is, as illustrated in FIGS. 9 and 10, a film 2 to be exposed is conveyed by being rolled up between each step until the film is processed from a film base material to a film that is the finished product. In the process of being supplied to the exposure apparatus, with a roll of the film mounted coaxially onto the supply-side roller 80, the film 2 is sequentially taken up from a leading end by the take-up-side roller 81. As illustrated in FIG. 9, the practice has been to use exposure light to continuously irradiate, for example, an oriented coating formed on the surface of the film, having been passed through the exposure apparatus, spanning from the supply-side roller 80 to the take-up-side roller 81, thus exposing a predetermined exposure region of the film along the movement direction of the film. This format is called a roll-to-roll format.

In a case where a film is exposed in a roll-to-roll format, the film 2 may in some cases meander in a direction perpendicular to the movement direction while the film 2 is being fed from the supply-side roller 80 toward the take-up-side roller 81, as illustrated in FIG. 10, due to, for example, the spacing between the roll of film and the rollers 80, 81 of the conveying apparatus, an error in take-up of the film into the roll, or the like, and a problem has emerged in that this causes a decline in the exposure accuracy for the film 2.

There have accordingly been proposed a variety of techniques for correcting the meandering of the film, as is disclosed in, for example, Patent Documents 2 and 3. The technique disclosed in Patent Document 2 is one where a detector for detecting an edge position of a web such as a film is provided and, depending on the detection result of the detector, the supply-side roller is moved in the axial direction by a cylinder or the like to correct for meandering of the web in a direction perpendicular to the movement direction.

Patent Document 3 discloses a technique where, in a case where a long work piece such as a film is exposed in two separate cycles, then during the first cycle of exposure, a pattern is formed on the work piece and markings for alignment are added intermittently at equal intervals of a predetermined pattern length, and during the second cycle of exposure, the positional deviation and incline of the work piece are detected by imaging the alignment marks and the mask position and incline are corrected.

FIG. 11 is a drawing illustrating by way of example a conventional exposure apparatus of a model where exposure light sources 11 for emitting an exposure light are arranged so as to be face-to-face in increments of pairs each corresponding to one mask 12, and irradiate with the exposure light from mutually different directions. An exposure apparatus of such a model is used, for example, to expose an oriented material coating in the process of forming an oriented coating on a glass substrate such as a liquid crystal display or on a film base material such as a polarizing film. That is, in a case where an oriented coating is formed by exposure using the exposure apparatus, the practice is to supply to the exposure apparatus a member to be exposed on the surface of which an oriented material coating has been formed and respectively irradiate predetermined regions from different directions with the exposure light to form an oriented coating that has been oriented in different directions. According to the exposure apparatus of such description, it would be possible to, for example, segment a region of the film corresponding to one picture element into two in the width direction thereof, or to respectively segment the film in the width direction thereof into regions corresponding to a pixel, and form an oriented coating with different orientation directions respectively in each of the segmented regions. This feature of the orientation direction of the oriented coating causes the liquid crystal molecules sandwiched between glass substrates to behave differently when a voltage is applied, depending on the orientation direction of the oriented coating, and this makes it possible to broaden the angle of view of a display apparatus and moreover makes it possible to use the film thus produced also as a polarizing film for a three-dimensional (3D) display or the like; there has been growing focus of late on such techniques of film exposure.

When a film is exposed by such an exposure apparatus, the film is susceptible to suffering undulation while being conveyed, and a problem has emerged in that this causes a deviation in the exposure position. In order to reduce the impact of this deviation in exposure position, one practice of exposure with, for example, an exposure apparatus where a plurality of light sources is arranged side by side in the movement direction of the film as described above has been to not to use one mask in exposure but rather to use a plurality of masks 12, as illustrated in, for example, FIGS. 11 and 12, where each of the masks 12 is arranged in a staggered fashion so as to be side by side in the direction of movement of the member to be exposed and the width direction perpendicular thereto, and a exposure light source 11 is provided for each of the masks. Exposed light from the exposure light sources is then transmitted through masks 121 to 124 and, as illustrated in FIG. 12, on an upstream side from which the film is being supplied, the film 2 is exposed at exposure regions A and C by the masks 121 and 122, which are arranged spaced apart from each other, while on the downstream side a region B between the exposure regions A and C is exposed by the mask 123 and a region D adjacent to the exposure region C is exposed by the mask 124. This makes it possible to form at high accuracy a pattern of segmented orientation on substantially the full surface of the film 2.

PATENT DOCUMENTS

Patent Document 1: Japanese Patent Application Kokai Publication No. 5-323621
Patent Document 2: Japanese Patent Application Kokai Publication No. 8-301495
Patent Document 3: Japanese Patent Application Kokai Publication No. 2009-216861

DISCLOSURE OF THE INVENTION

Problems the Invention is Intended to Solve

However, the following problems have emerged in the prior art described above. The technique disclosed in Patent document 1 is not suitable for cases where the work piece is continuously supplied by a conveying apparatus or the like. That is, with the exposure apparatus of Patent document 1, the detection of the alignment marks and the correction of the mask position are carried out in a state where the conveyance of the work piece has been stopped. In particular in a case where a film is supplied in a roll-to-roll format and is exposed, the film in some cases meanders in a direction perpendicular to the movement direction, as stated above, and it is necessary to stop conveyance of the work piece each time the mask position is corrected. Accordingly, a case such as where, for example an exposure region is continuously formed in a strip-shaped fashion will have extremely low productivity. In the technique disclosed in Patent document 3, too, the alignment marks are arranged only at every predetermined interval; enhancing the exposure accuracy would require stopping the conveyance of the work piece in order to detect the alignment marks and then correcting the mask position, and productivity is low.

Meandering of the film in a direction perpendicular to the movement direction, as illustrated in FIG. 10, would also occur periodically in a case where an apparatus for conveying the film as is disclosed in Patent Document 2 is used. Further, the technique disclosed in Patent Document 2 is directed toward resolving meandering of the film with respect to the conveying apparatus, and does not take into consideration the exposure accuracy imparted by the exposure apparatus. As such, the technique is unable to resolve the decline in exposure accuracy caused by the meandering of the film.

Additionally, in the technique disclosed in Patent Document 3, similarly with respect to Patent Document 1, the detection of the alignment marks and the correction of the mask position are carried out in a state where the conveyance of the work piece has been stopped, and a case where the film is to be exposed continuously will have low productivity.

With an exposure apparatus having a plurality of masks 12 illustrated in FIGS. 11 and 12, in which the exposure light is irradiated using each of the masks 12, a portion into which the exposure light sources 11 are built in (a chassis portion for the exposure light sources 11) has a length of, for example, about 2 m in the movement direction of the film for one light source, as illustrated in FIG. 11, and the distance between the exposure regions A and C and the exposure regions B and D as illustrated in FIG. 12 is longer, at least about 4 m. A problem accordingly emerges in that during the conveyance from the exposure regions A and C on the upstream side toward the exposure regions B and D on the downstream side, the film readily undulates and is susceptible to deviation in the width direction perpendicular to the movement direction thereof. As such, at an exposure region on the downstream side in the movement direction of the film, a problem emerges in that the positional deviation of the film in the width direction results in exposure of a region that has already been exposed, as well as in occurrence of an unexposed region.

To resolve the problems, the applicant proposed in Japanese Patent Application No. 2010-089608 a technique for forming alignment marks at a side part on a film base material, detecting by charge-coupled device (CCD) camera the deviation of the alignment marks in the width direction of the film on the downstream side in a movement direction of the film, and adjusting in the width direction of the film the positions of marks 123 and 124 on the downstream side on the basis of the detection signal to correct for deviation of an exposure region. However, this prior technique is one where the alignment marks were formed by a laser marker, which is fixed to a constant position, and in a case where the film has meandered, the relative positions of the alignment marks with respect to the film will also have meandered. As such, when alignment marks that have been formed so as to meander with respect to the movement direction of the film serve as a reference for determining the mask position, the exposure region is thereby formed so as to also meander with respect to the movement direction of the film. In a case where the alignment marks are formed so as to meander in a relative fashion with respect to the film, the formation error thereof is considerable, and the detection error imparted by the CCD camera, which is provided so as to correspond to each mask, is added onto the formation error for the alignment marks, somewhat lowering the accuracy in setting the mask position.

The present invention has been contrived in view of the foregoing problems, and an objective thereof is to provide an exposure apparatus that enables highly accurate, stable exposure whereby, even in a case where the member is supplied continuously, an alignment mark for mask position adjustment can be changed in accordance with the meandering of the member to be exposed and the position of the mask with respect to the member to be exposed can be accurately adjusted.

Means for Solving the Problems

An exposure apparatus as in the present invention for causing an exposure pattern formation region of a member to be exposed continuously conveyed by a conveying apparatus to be irradiated, via masks, with an exposure light emitted from an exposure light source, whereby the exposure pattern formation region is exposed to a mask pattern corresponding to each of the masks, the exposure apparatus comprising: a first mask-forming unit for forming a meandering-detection mark on the member to be exposed, the first mark-forming unit being arranged further upstream than an irradiation position for the exposure light in a direction of movement of the member to be exposed; a first detection unit for detecting a position of the meandering-detection mark in a direction intersecting the direction of movement of the member to be exposed, the first detection unit being arranged between the first mark-forming unit and the irradiation position for the exposure light in the direction of movement of the member to be exposed; a first meandering computation unit for computing an amount of meandering by the meandering-detection mark on the basis of the position of the meandering-detection mark as detected by the first detection unit; a second mark-forming unit for forming an alignment mark for adjusting a position of the mask, the second mark-forming unit being arranged so as to be capable of moving in a direction perpendicular to the direction of movement of the member to be exposed, at a position corresponding to a position of the first detection unit in the direction of movement of the member to be exposed; and a first control unit for moving the second mark-forming unit so as to negate the amount of meandering by the meandering-detection mark as found by the first meandering computation unit.

The exposure apparatus has, for example: a second detection unit for detecting a position of the alignment mark in a direction intersecting the direction of movement of the member to be exposed, the second detection unit being arranged on a downstream side of the second mark-forming unit in the direction of movement of the member to be exposed; a second meandering computation unit for computing an amount of meandering by the alignment mark on the basis of the position of the alignment mark at the index position as detected by the second detection unit; and a second control unit for adjusting the positions of the masks in a direction perpendicular to the direction of movement of the member to be exposed in accordance with the amount of meandering by the alignment mark as found by the second meandering computation unit.

In the exposure apparatus, for example, there is a plurality of the masks, arranged spaced apart in the direction of movement of the member to be exposed, and the second meandering computation unit and the second control unit are provided correspondingly with respect to each of the masks. The second mark-forming unit, for example, continuously or intermittently forms the alignment mark on the member to be exposed in the direction of movement of the member to be exposed.

The first mark-forming unit is, for example, adapted for forming on the member to be exposed the mark for meandering direction, by which an intermittent index is imparted in the direction of movement of the member to be exposed; and the first detection unit is adapted for detecting the position of the meandering-detection mark at the index position in a direction intersecting the direction of movement of the member to be exposed.

Effects of the Invention

The exposure apparatus as in the present invention has the first mark-forming unit for forming the meandering-detection mark on the member to be exposed, further upstream than the irradiation position for the exposure light in the direction of movement of the member to be exposed; and the first detection unit for detecting the position of the meandering-detection mark in a direction intersecting the direction of movement of the member to be exposed; the first meandering computation unit computes the amount of meandering by the meandering-detection mark on the basis of the position of the meandering-detection mark as detected by the first detection unit, the first control unit moves the second mark-forming unit, arranged at a position corresponding to the position of the first detection unit, so as to negate the amount of meandering by the meandering-detection mark as found by the first meandering computation unit, and the alignment mark for mask position adjustment is formed by the second mark-forming unit. That is, even in a case where the member to be exposed is supplied continuously and has meandered in a direction perpendicular to the movement direction, the second mark-forming unit forms the alignment mark so as to negate the amount of meandering thereby. The alignment mark is thereby formed rectilinearly in a relative fashion with respect to the member to be exposed. Accordingly, the rectilinear alignment mark can be used to accurately adjust the mask positions, and the member to be exposed can be continuously exposed stably and a high accuracy.

The second mark-forming unit forms the alignment mark so as to be rectilinear in a relative fashion with respect to the member to be exposed, and therefore the formation error thereof is extremely small in comparison to a case where the alignment mark is formed so as to meander in a relative fashion with respect to the member to be exposed. Accordingly, using the alignment mark to adjust the mask positions makes it possible to exposure with high accuracy, because the accuracy for setting the mask positions is heightened substantially without any detection error being added to the formation error for the alignment mark, even in a case where, for example, a CCD camera or other detection unit for adjusting the mask position has a detection error due to individual differences.

BRIEF DESCRIPTION OF THE DRAWINGS

FIG. 3 is a drawing illustrating correction of a formation position of an alignment mark by detection of a meandering amount in an exposure apparatus as in an embodiment of the present invention;

FIGS. 4A to 4C are drawings illustrating by way of example a mode for forming alignment marks in an exposure apparatus as in an embodiment of the present invention;

FIGS. 13A and 13B are drawings illustrating by way of example an exposure region of a film exposed by an exposure apparatus.

BEST MODE FOR CARRYING OUT THE INVENTION

Figure 1:
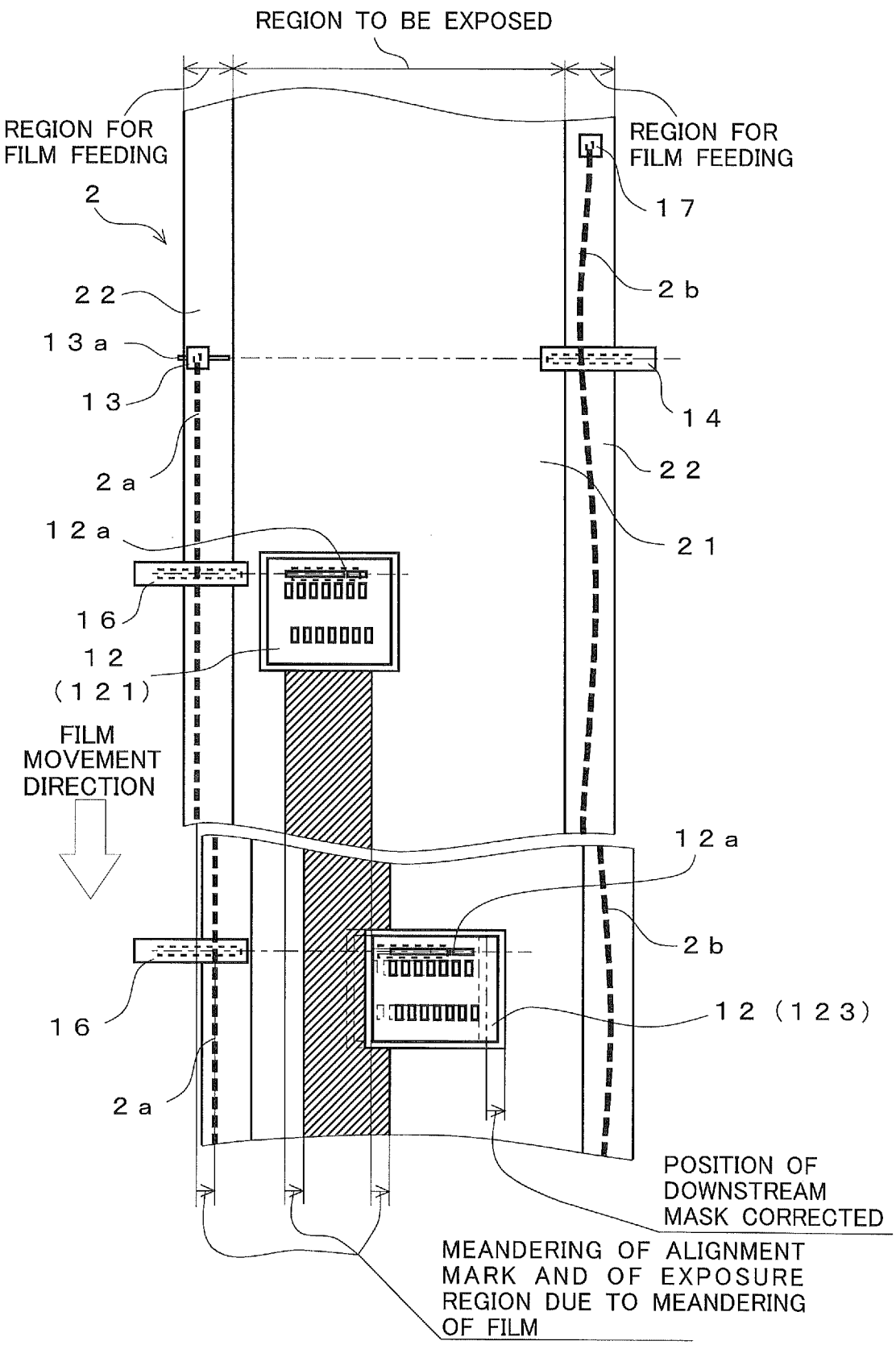
FIG. 1 is a plan view illustrating exposure of a film by an exposure apparatus as in an embodiment of the present invention.

The following describes in greater detail an embodiment of the present invention, with reference to the accompanying drawings. First, the configuration of an exposure apparatus for exposing a film as in an embodiment of the present invention shall be described. FIG. 1 is a plan view illustrating exposure of a film by the exposure apparatus as in the embodiment of the present invention, FIGS. 2A to 2E illustrate meandering of a meandering-detection mark, and FIG. 3 is a drawing illustrating correction of a formation position of an alignment mark by detection of a meandering amount in the exposure apparatus as in the embodiment. The exposure apparatus 1 as in the present embodiment is similar to the conventional exposure apparatus illustrated in FIGS. 9 to 12 and has an exposure light source 11 for emitting exposure light, masks 12, an optical system for irradiating a film 2 via the masks 12 with the exposure light emitted from the exposure light source 11, and a film conveyance unit such as, for example, a conveyance roller, for conveying the film 2; a member to be exposed 20 of the film or a glass substrate on the surface of which an exposure material coating has been formed is irradiated via the masks 12 with the exposure light emitted from the exposure light source 11 by an optical system of, for example, a collimator lens and/or a reflecting mirror or the like, to optically orient an exposure material coating such as, for example, an oriented material coating so as to correspond to a mask pattern, thus forming an oriented coating. In a case where the member to be exposed is a glass substrate, the mask pattern is consecutively and continuously exposed onto the exposure material coating of the glass substrate surface at an irradiation position for the exposure light, by placing and then conveying the glass substrate on a movable conveying apparatus such as a conveyance stage. Alternatively, in a case where the member to be exposed is the film 2, the film 2 having been supplied from a supply-side roller 80 is taken up in a roll-to-roll format by a take-up-side roller 81 while a state of tension of the film 2 is maintained, similarly with respect to convention, during which time the exposure material coating of the film surface is irradiated with the exposure light and the exposure material coating is sequentially and continuously exposed. In the conveying apparatus for the film 2, for example, at least one conveyance roller 9 for conveying the film 2 is arranged also between the two rollers 80, 81, and the conveyance roller(s) 9 and the like are driven by, for example, a motor. The present embodiment describes a case where the film 2 is used as the member to be exposed 20, but a case where the member to be exposed 20 is a glass substrate would also be similar with respect to the present embodiment as regards matters other than the configuration of the conveying apparatus.

Figure 9:
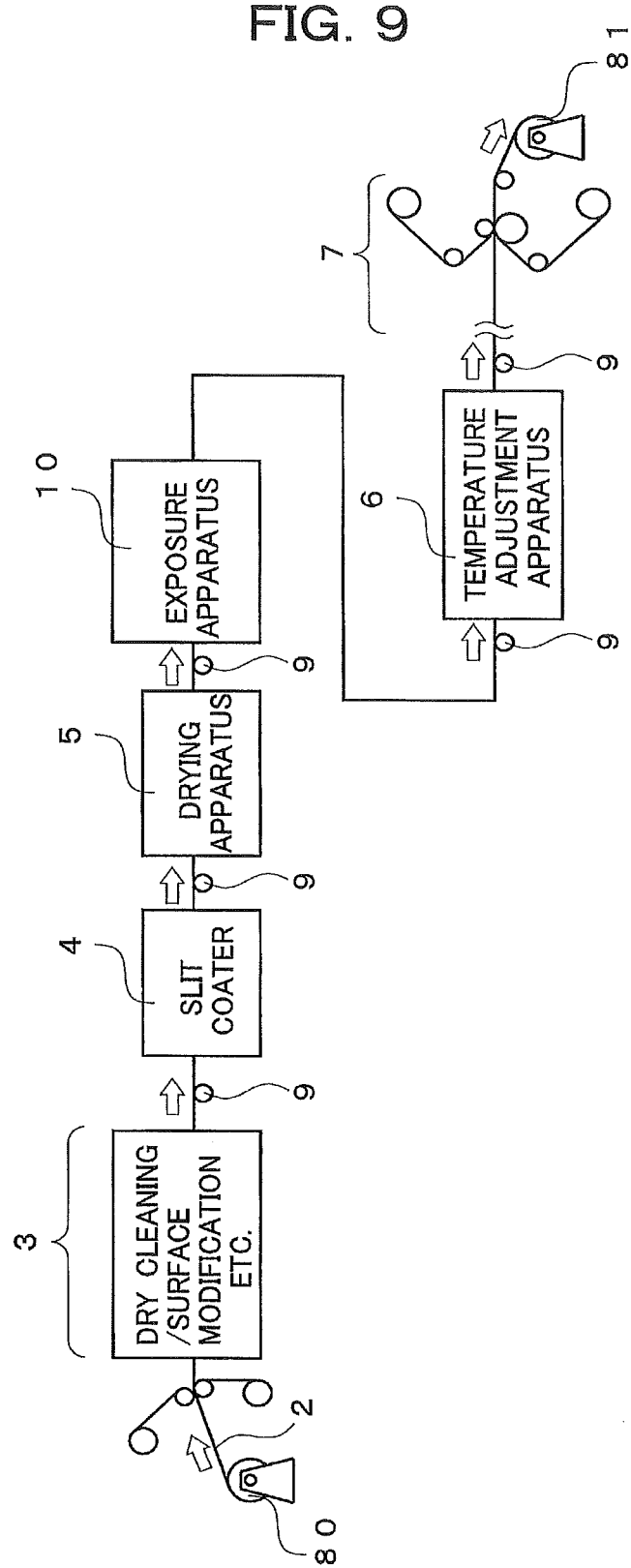
FIG. 9 is a schematic drawing illustrating by way of example the exposure of a film by a conventional roll-to-roll format.
Figure 10:
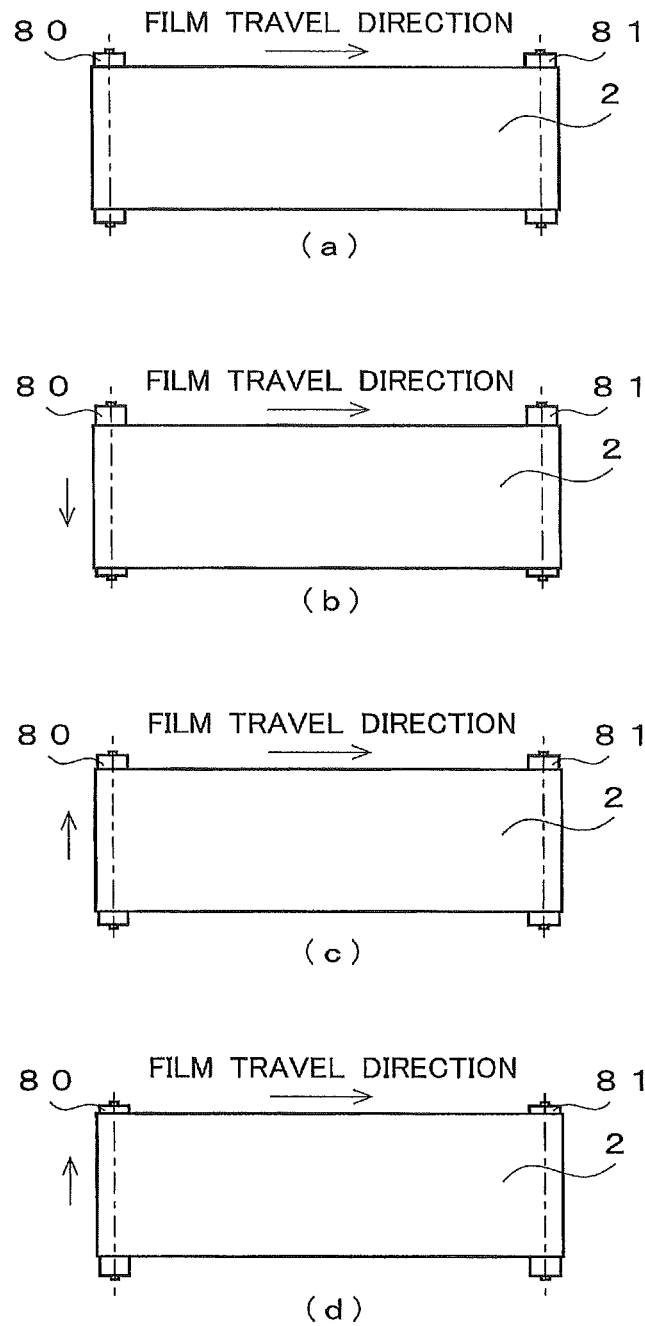
FIG. 10 is a schematic drawing illustrating meandering of a film in a direction perpendicular to a movement direction of the film in a film conveying apparatus of a conventional roll-to-roll format.
Figure 11:
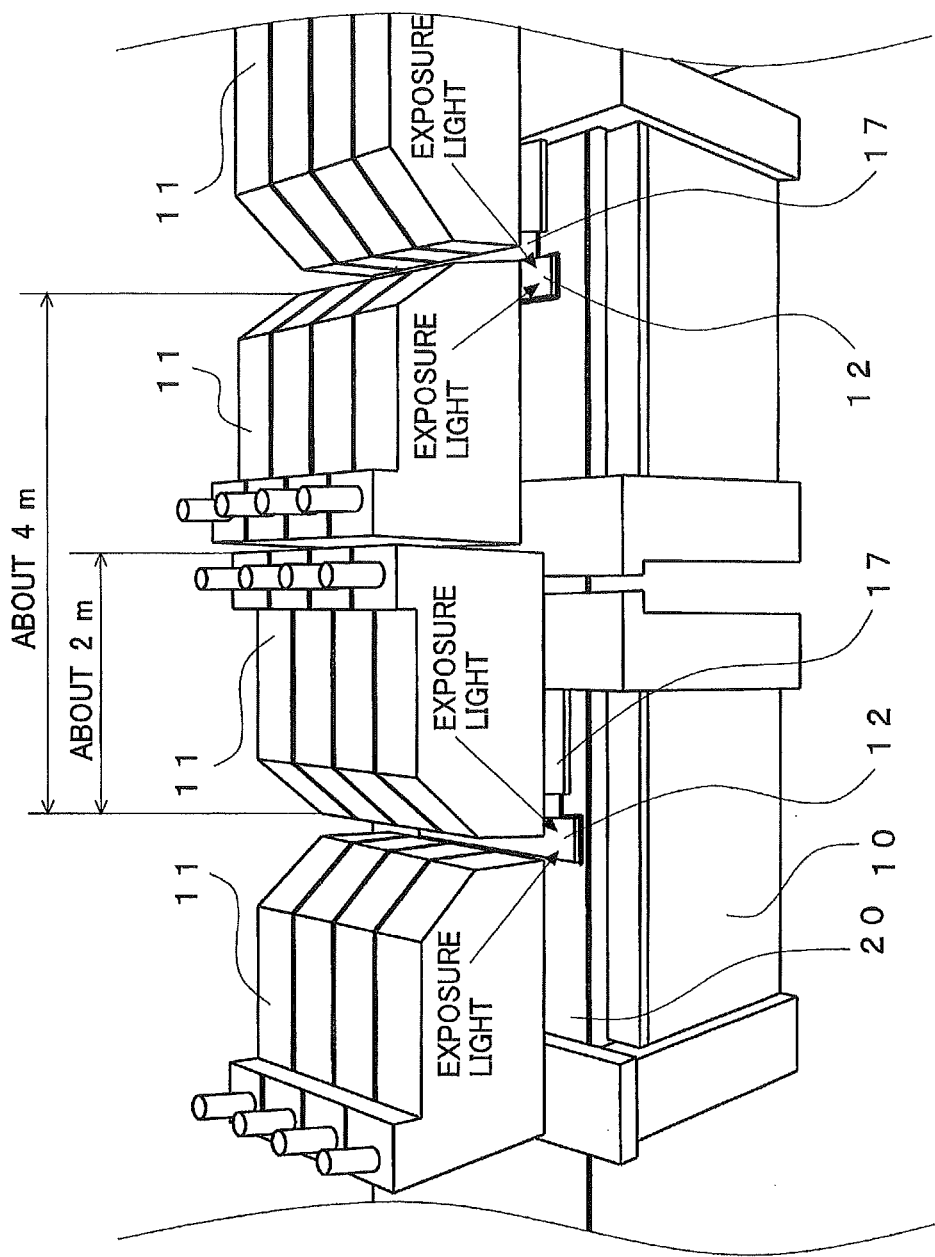
FIG. 11 is a perspective view illustrating by way of example an exposure apparatus of a segmented orientation format.
Figure 12:
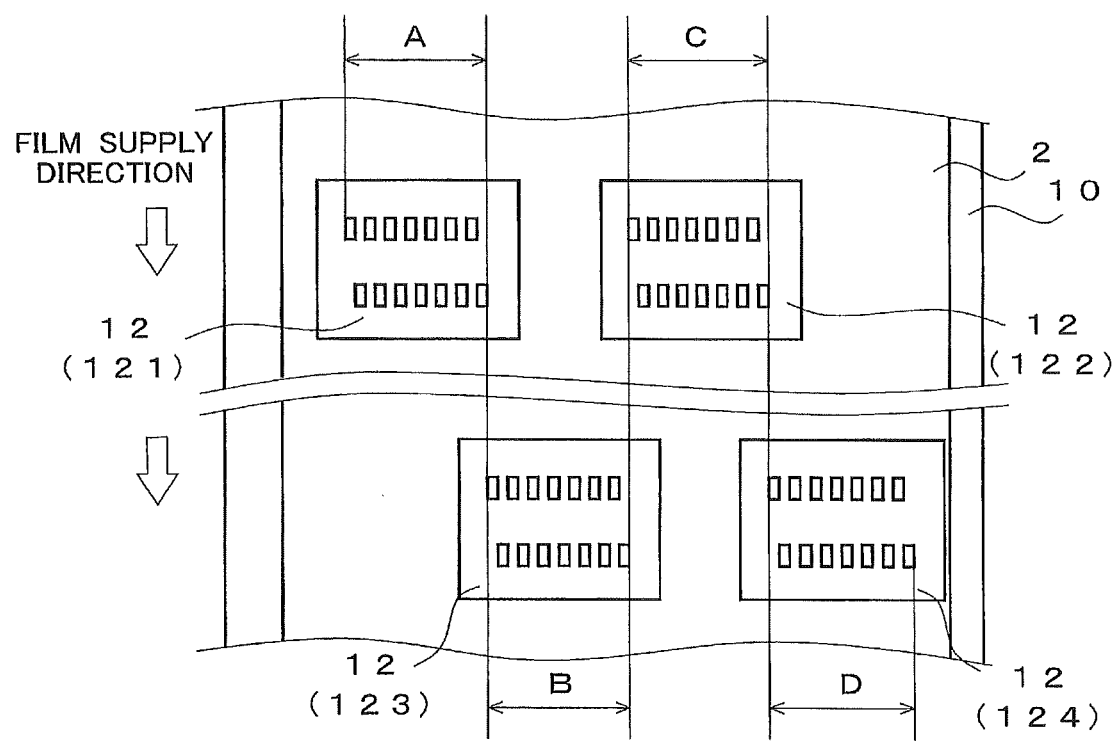
FIG. 12 is a drawing illustrating by way of example an exposure apparatus of a configuration where a plurality of light sources are arranged in a movement direction of a film.

In the present embodiment, similarly with respect to a conventional exposure apparatus 10 as is illustrated in FIG. 9, the film 2 to be exposed is, for example, unwound from a supply-side roller 80 of a roll-to-roll format and supplied into the exposure apparatus 1, during which time the film to be exposed is supplied to a slit coater 4 and a coating of a predetermined exposure material, e.g., an optically orientable material, is applied to the surface of a film base material 20 by the slit coater 4. The applied exposure material is fired or dried by a drying apparatus 5, thus forming a predetermined exposure material coating on the surface of the film base material 20. The film 2 on the surface of which the exposure material coating has been formed is supplied to the exposure apparatus 1. The present embodiment describes a case where the exposure material coating 21 formed on the surface of the film 2 is an orientation material coating.

As illustrated in FIG. 1, provided to the exposure apparatus 1 of the present embodiment is a laser marker 17 (a first mark-forming unit in the present invention) further upstream than an irradiation position for exposure light (a formation position for a mask pattern) in a movement direction of the film 2; a line CCD 14 for meandering detection (a first detection unit in the present invention) is provided between the laser marker 17 and the irradiation position for the exposure light, in the movement direction of the film 2. In the present embodiment, the laser marker 17 and the line CCD 14 are arranged above one of two side parts of the film 2 to be irradiated, e.g., above a region being used for film feeding or the like. Above the other side part of the film 2, a laser marker 13 for alignment is provided to a position corresponding to that of the line CCD 14 in the movement direction of the film 2. Downstream of the laser marker 13 for alignment in the movement direction of the film 2, a line CCD 16 (a second detection unit) is provided to a position corresponding to that of each of the masks 12. In the present embodiment, as illustrated in FIG. 1, the masks 12 are provided one each to an upstream side and a downstream side, and the line CCDs 16 are arranged one each on the upstream side and the downstream side in the movement direction of the film 2 so as to correspond to each of the masks 121, 123. However, though the present embodiment describes a case where one side part of the film 2 is used as a formation region for a mark 2b for meandering detection and the other film side part is used as a formation region for an alignment mark 2a, the marks 2a and 2b need only be formed in a region other than a exposure pattern formation region on the film 2, e.g., in a region that will not serve as an image display region when used in a display apparatus such as a liquid crystal display. Possible examples for the region that will not serve as an image display region conventionally include a film side part that is used for a region for film feeding or the like, as illustrated in FIG. 13A, for example. Alternatively, in a case where one film 2 is segmented in the width direction perpendicular to the movement direction thereof to produce a plurality of polarizing films or the like, as illustrated in FIG. 13B, then, for example, a region between regions that will serve as the polarizing films is one region that is not used, and thus the mark 2b for meandering detection and/or the alignment mark 2a are formed in this unused region between the regions to be exposed.

The laser marker 17 is provided with a laser light source for irradiating with, for example, an Nd:YAG laser, ultraviolet light, or the like, and, for example, emits a pulse laser light from a pulse light source such as a xenon flash tube to intermittently form the mark 2b for meandering detection with, for example, 20 μm in width and 15 mm in length, at the side part of the film 2 within, for example, 25 mm from the edge of the film 2. To heighten the detection accuracy for the film meandering imparted by the line CCD 14 for meandering detection (described below), for example, two rows of marks 2b for meandering detection may be formed in a staggered fashion to each other by the laser marker 17, as illustrated in FIG. 4A, a leading end and trailing end of each of the two strip-shaped marks 2b for meandering detection then being formed so as to overlap with each other when seen in a direction intersecting the movement direction of the film 2. In such a case, the leading end and the trailing end of each of the marks 2b for meandering detection are used as an index for meandering detection. Alternatively, for example, each of the marks 2b for meandering detection may be formed so as to incline in the same direction with respect to the movement direction of the film, as illustrated in FIG. 4B, the leading end and the trailing end of each of the marks then be used as an index for detecting meandering of the alignment mark 2a. Alternatively, as illustrated in FIG. 4C, one mark 2b for meandering detection may be continuously formed so as to extend in the movement direction of the film, an intermittent index then being provided in, for example, a direction that intersects with the movement direction of the film.

The line CCD 14 for meandering detection detects the position of the mark 2b for meandering detection formed by the laser marker 17 with respect to a direction intersecting the film movement direction. That is, the film 2 may in some instances move in a direction perpendicular to the movement direction of the film 2, due to, for example, the spacing between the rollers 80, 81 of the conveying apparatus and the roll of the film, an error in the take-up of the film into the roll, or the like. In such a case, the meandering of the film 2 in the direction perpendicular to the movement direction thereof is gradually transferred toward the upstream side, due solely to downstream meandering toward the take-up-side roller 81. This causes the film 2 to experience meandering in a direction perpendicular to the movement direction thereof while being conveyed from the laser marker 17 to the line CCD 14, as illustrated in FIGS. 2A to 2E. In the present embodiment, the position of the mark 2b for meandering detection, having meandered in association with the film meandering, is detected by the line CCD 14 arranged so as to extend in a direction perpendicular to the movement direction of the film 2. The line CCD 14 uses, for example, the leading end and the trailing end of the mark 2b for meandering detection as an index for meandering detection to detect the position thereof.

Figure 5:
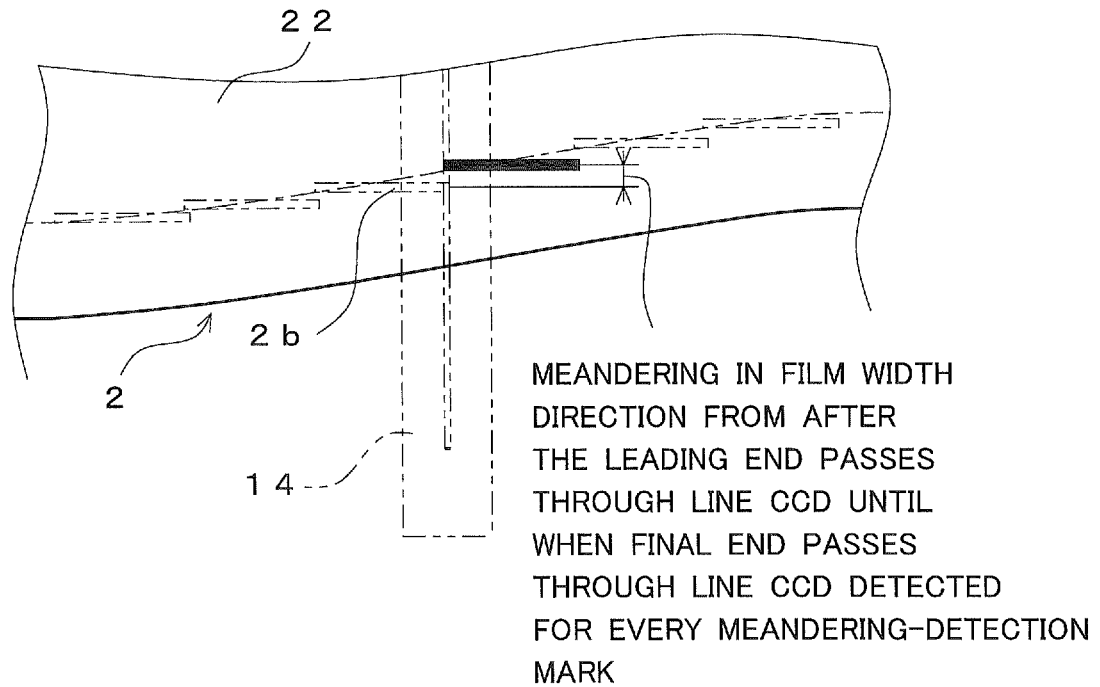
FIG. 5 is a drawing illustrating by way of example a method for detecting a meandering-detection mark in an exposure apparatus as in an embodiment of the present invention.

FIG. 5 is a drawing illustrating by way of example a method for detecting meandering of the mark 2b for meandering detection in the exposure apparatus of the present embodiment. FIG. 5 illustrates the movement trajectory for one mark 2b for meandering detection in a case where the film 2 has meandered in a direction perpendicular to the movement direction thereof. In the present embodiment, the line CCD 14 uses, for example, the leading end and the trailing end of each of the marks 2b for meandering detection as an index to detect the positions of the leading end and the trailing end of the mark 2b for meandering detection in a direction intersecting the film movement direction, as illustrated in FIG. 5. A case where the marks 2b for meandering detection are formed so as to overlap with each other as seen in a direction intersecting the movement direction of the film 2, as illustrated in FIGS. 4A to 4C, is preferable because an interval where measurement by the line CCD 14 is impossible is eliminated and the accuracy at which the line CCD 14 detects the meandering of the marks 2b for meandering detection is heightened. The line CCD 14 is connected to a control apparatus 30 (described below); a signal for the position of the mark 2b for meandering detection detected by the line CCD 14 is sent to the control apparatus 30, and the amount of meandering by the film 2 is calculated.

The laser marker 13 for alignment, similarly with respect to the laser marker 17, is provided with a laser light source for irradiating with, for example, an Nd:YAG laser, ultraviolet light, or the like, and, for example, emits a pulse laser light from a pulse light source such as a xenon flash tube to intermittently form the alignment mark 2a with, for example, 20 µm in width and 15 mm in length, at the side part of the film 2 within, for example, 25 mm from the edge of the film 2. Alternatively, the laser marker 13 for alignment forms a continuous alignment mark 2a. In the present embodiment, as illustrated in FIG. 1, the laser marker 13 for alignment is supported so as to be movable in a direction perpendicular to the movement direction of the film 2 by a guide member 13a extending in a direction perpendicular to the movement direction of the film 2. The laser marker 13 for alignment is adapted to enable adjustment as appropriate of the formation position for the alignment mark 2a on the film 2, by being moved along the guide member 13a.

In the present embodiment, the position of the laser marker 13 for alignment, as illustrated in FIG. 3, is corrected so as to negate the amount of meandering by the film 2 as calculated by the control apparatus 30 using the position of the mark 2b for meandering detection measured by the line CCD 14. That is, in a case where the film 2 has meandered from the state illustrated in FIG. 3A, passing by way of the state illustrated in FIG. 3B, to the state illustrated in FIG. 3C, then the line CCD 14 detects the position of the mark 2b for meandering detection in each of the states and the control apparatus 30 calculates the amount of upward meandering by the film 2 in FIG. 3 on the basis of this detection result. The control apparatus 30 then moves the position of the laser marker 13 for alignment to match the amount of meandering by the film 2 so as to negate the amount of upward meandering by the film 2 in FIG. 3. This makes it possible for the laser marker 13 for alignment to not move in terms of the relative position with respect to the film 2 and, as such, to form the alignment mark 2a rectilinearly in a relative fashion with respect to the film 2.

Figure 6:
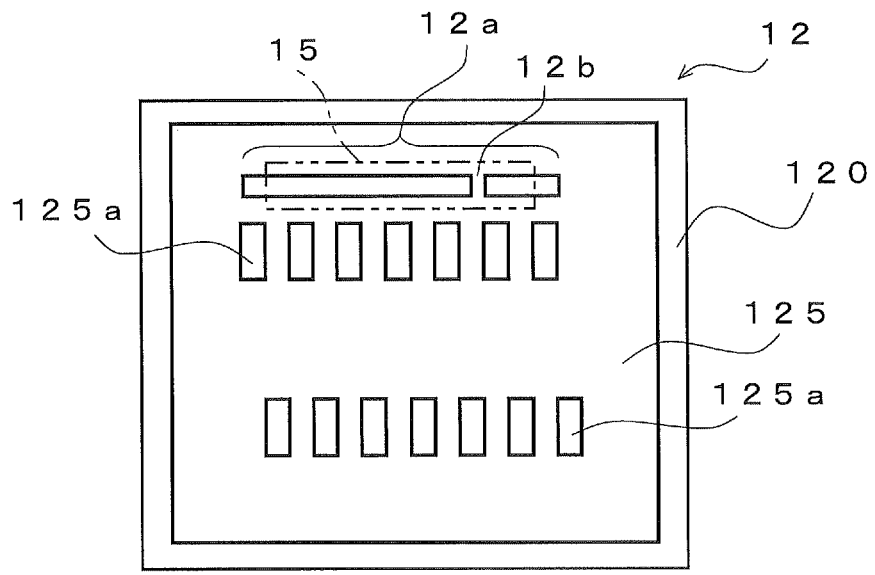
FIG. 6 is a drawing illustrating a mask by way of example.

The line CCDs 16 for alignment mark detection are arranged above or below the film 2 so as to be side by side in the width direction of the film with each of the masks 121, 123 at positions corresponding to the positions of the masks 121, 123 in the movement direction of the film 2, and are adapted to detect the position of the alignment mark 2a at the positions corresponding to those of the masks 12. As illustrated in FIG. 6, the line CCDs 16 for alignment mark detection detect the position of the alignment mark 2a in a direction intersecting the movement direction of the film 2 at, for example, positions corresponding to viewing windows 12a of the masks 12. For example, in a case where the film 2 has meandered in the width direction thereof while moving, the alignment mark 2a will also deviate in association therewith in the width direction of the film 2, by an amount commensurate with the amount of meandering thereby, but the line CCDs 16 for alignment mark detection detect the position of the alignment mark 2a having deviated in the width direction due to the meandering.

Figure 7:
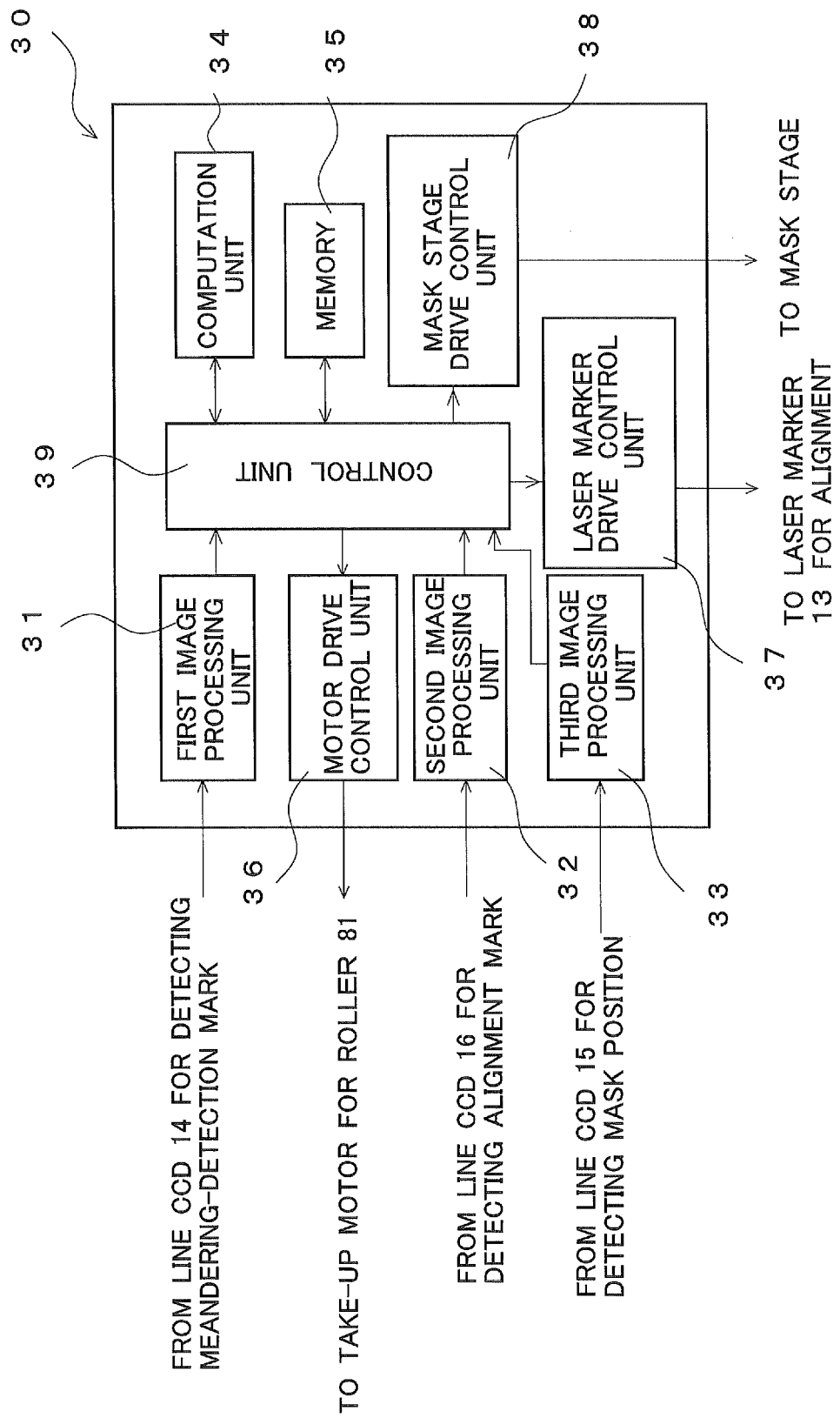
FIG. 7 is a drawing illustrating by way of example a control apparatus for controlling the position of an alignment mark-forming unit and a mask position.

The line CCDs 16 are connected to, for example, the control apparatus 30 as is illustrated in FIG. 7. The detected position of the alignment mark 2a in the film width direction is then sent to the control apparatus 30. The control apparatus 30 is adapted to adjust the position of each of the masks 12 on the basis of the positions of the alignment mark 2a sent from the lines CCD 16. This makes it possible for the exposure apparatus 1 as in the present embodiment to form the alignment mark 2a and adjust the positions of the masks 12 by the amount of meandering thereby.

The exposure light source 11 in the present embodiment is a light source for emitting, for example, ultraviolet light; for example, a light source that is a mercury lamp, a xenon lamp, an excimer lamp, an ultraviolet light-emitting diode (LED), and the like and emits a continuous light or a pulse laser light is used. In the present embodiment, an optical system of, for example, a collimator lens and/or a reflecting mirror or the like is arranged on an optical path of the exposure light emitted from the exposure light source; for example, the configuration is such that the oriented material coating (the exposure material coating 21) formed on the region for pattern formation on the exposure material coating on the film 2 is irradiated with the exposure light at a predetermined quantity of light. The exposure light source allows for the adjustment of the emission direction of the exposure light by, for example, a control apparatus (not shown), and is thereby adapted to enable adjustment of the angle of incidence of the exposure light with respect to the film 2. In the exposure apparatus 1 of the present embodiment, two exposure light sources are face to face for each one exposure region, and are arranged so as to be side by side in the movement direction of the film 2. The oriented material coating (exposure material coating 21) is thereby irradiated via the masks 12 with two exposure lights each of different pretilt angles emitted from each of the exposure light sources, and the oriented material coating is exposed segmented in the width direction perpendicular to the movement direction thereof to form, on the film base material, oriented coatings where the orientation directions are mutually different in adjacent segmented regions. Such a format of exposure apparatus is called a segmented orientation format. When an oriented coating where, for example, a region that will serve as one picture element is segmented into two in the width direction thereof is used and a voltage is applied to a display apparatus in which a liquid crystal is sandwiched between oriented coatings, then this causes the orientation of the liquid crystal molecules when the voltage is applied to become two directions within the one picture element, in accordance with the orientation directions of the oriented coatings, and makes it possible to broaden the angle of view of the liquid crystal display or the like. It would also be possible for a film where oriented coatings of different orientation directions are formed in regions that will serve as pixels adjacent to each other in the width direction to be used as a polarizing film in, for example, a three-dimensional (3D) display. The exposure light source is not limited to being two in number for one exposure region, but rather three or more may be provided, and, for example, the oriented coating material may be oriented in three or more directions by exposure light coming from mutually different directions. Further, one exposure light source may be provided for one exposure region, the configuration then being such that the exposure light emitted from the exposure light source is segmented into two or more by a polarizing plate or the like for irradiation with the segmented exposure lights from mutually different directions. For example, it would be possible to segment the exposure light by using a polarizing plate into a linearly polarized exposure light of P polarization and a linearly polarized exposure light of S polarization, and to irradiate from mutually different directions.

The masks 12 are constituted of, for example, a frame body 120 and a pattern formation section 125 in the middle thereof, as illustrated in FIG. 6; patterns 125 of a predetermined light transmission region are formed in the pattern formation section 125. That is, either openings through which the exposure light is transmitted are formed or light-transmissive members are installed on the pattern formation section 125 so as to correspond to the pattern shape formed on the film 2. In an exposure apparatus of, for example, the segmented orientation format, the mask pattern is exposed onto the oriented material coating on the surface of the film 2, by the transmitted light of the pattern formation section 125. In the present embodiment, one pair of exposure light sources is arranged for each of the masks 12, and exposure lights of respectively different angles of incidence are emitted. As such, in the present embodiment, the patterns 125a correspond to the two exposed lights of different angles of incidence, and a plurality of rectangular opening patterns are provided on the upstream side and the downstream side in the movement direction of the film. The light transmission region groups on the upstream side and the downstream side are formed spaced apart from each other so that irradiation regions for the exposure light do not overlap with each other. The upstream pattern and the downstream pattern are formed staggered along the width direction thereof so that, for example, the exposure regions imparted by the upstream pattern and the downstream pattern are adjacent to each other.

In the present embodiment, the viewing window 12a for line CCD, about 300 µm in width and about 250 mm in length, is provided to the masks 12 further upstream (on FIG. 6) than the patterns 125a so as to extend in the width direction perpendicular with respect to the movement direction of the film 2; a line-shaped light-blocking pattern 12b, for example, about 15 µm in width for blocking the exposure light is provided midway in the viewing window 12a in the lengthwise direction. Additionally, for example, a line CCD 15 for mask position detection is provided below the masks 12; the position of the light-blocking pattern 12b is detected by the line CCD 15, and is used to adjust the position of the masks 12. The positions and shapes of the viewing window 12a and the light-blocking pattern 12b in the present embodiment are however one example, and the present invention is not limited by these positions and shapes, provided that accurate positioning of the masks 12 can be carried out. For example, the positions of the viewing window 12a and the light-blocking pattern 12b may be provided to a region between the patterns 125a formed so as to be side by side in two rows, or the like; for example, instead of the light-blocking pattern 12b, a plurality of slits that intersect each other (for example, in the shape of an "N") may be provided.

The masks 12 have, for example, a portion of the frame body 120 that is supported by a mask stage; the entirety of the masks 12 is adapted to be movable by moving the mask stage. The mask stage is connected, for example, to the control apparatus 30 as is illustrated in FIG. 7, and is adapted so that the position thereof can be moved in, for example, a horizontal direction (the width direction of the film, or the width direction of the film and the lengthwise direction of the film) by the control imparted by the control apparatus 30. This makes it possible to adjust the exposure position of the film 2 imparted by the masks 12 in the horizontal direction(s). The mask stage is also movable, for example, in a vertical direction, and is thereby adapted to permit adjustments so that the for example, oriented coating material on the film 2 is exposed at a predetermined size.

FIG. 7 is a drawing illustrating by way of example the configuration of the control apparatus 30 for controlling the position of the alignment mark-forming unit and the mask position. As illustrated in FIG. 7, the control apparatus 30 is connected to, for example, a mask stage drive unit and a control unit of a motor provided to the film-take-up-side roll 81. As illustrated in FIG. 7, the mask position control unit 30 is provided with: a first image processing unit 31 connected to the line CCD 14 for detecting the position of the mark 2b for meandering detection; a second image processing unit 32 connected to the line CCDs 16 for detecting the position of the alignment mark 2a at positions corresponding to the masks 12; a third image processing unit 33 connected to the line CCD 15 for mask position detection provided below the masks 12; a computation unit 34; a memory 35; a motor drive control unit 36; a laser marker drive control unit 37; a mask stage drive control unit 38; and a control unit 39.

The first image processing unit 31 carries out image processing for the mark 2*b* for meandering detection imaged by the line CCD 14 for detecting the position of the mark 2*b* for meandering detection, and detects the position of, for example, the leading end and the trailing end of each of the marks 2*b* for meandering detection in a direction intersecting the movement direction of the film. The second image processing unit 32 carries out image processing for the alignment mark 2*a* imaged by the line CCDs 16 for alignment mark detection, and detects the position of each of the alignment marks 2*a* in a direction intersecting the movement direction of the film. The third image processing unit 33 carries out image processing for the light-blocking pattern 12*b* of the masks 12 imaged by the line CCD 15 for mask position detection, and detects the position of the light-blocking pattern 12*b* in a direction intersecting the movement direction of the film. The computation unit 34 computes either the displacement or amount of meandering of each of the detection targets in a direction intersecting the movement direction of the film, on the basis of the detection results thereof. That is, the computation unit 34 computes the amount by which the mark 2*b* for meandering detection has meandered in a direction intersecting the movement direction of the film at the position of the line CCD 14, by using the detection result of the first image processing unit 31, uses the position of the alignment mark 2*a* and the position of the masks 12 to compute the distances between the two using the detection results of the second image processing unit 32 and the third image processing unit 33, and computes the deviation from the distance between the two that should be set, by using a relative positional relationship between the two that should be set and the actual relative positional relationship between the two in, for example, the width direction of the film. The memory 35 stores, for example, the detection results of the first image processing unit 31, the second image processing unit 32, and the third image processing unit 33, and the computation results of the computation unit 34. The motor drive control unit 36, for example, either drives or stops a motor of the film-take-up-side roller 81 or controls the rotational speed of when the motor is driven.

The laser marker drive control unit 37 is for controlling the drive of the laser marker 13 for alignment, and controls the movement direction and amount of movement of the laser marker 13 for alignment, for example, along the guide member 13*a*. The mask stage drive control unit 38 is for controlling the drive of the mask stage and, for example, is able to adjust the mask position by controlling the movement direction and amount of movement of the mask stage. The control unit 37 controls the first through third image processing units 31, 32, 33, the computation unit 34, the memory 35, the motor drive control unit 36, the laser marker drive control unit 37, and the mask stage drive control unit 38. The exposure apparatus 1 is thereby adapted to, for example, adjust the positions of the masks 12 and the position of the laser marker 13 for alignment in, for example, a direction intersecting the movement direction of the film, or the control of the rotation speed of the motor provided to the take-up-side roller 81 and the like.

Figure 2:
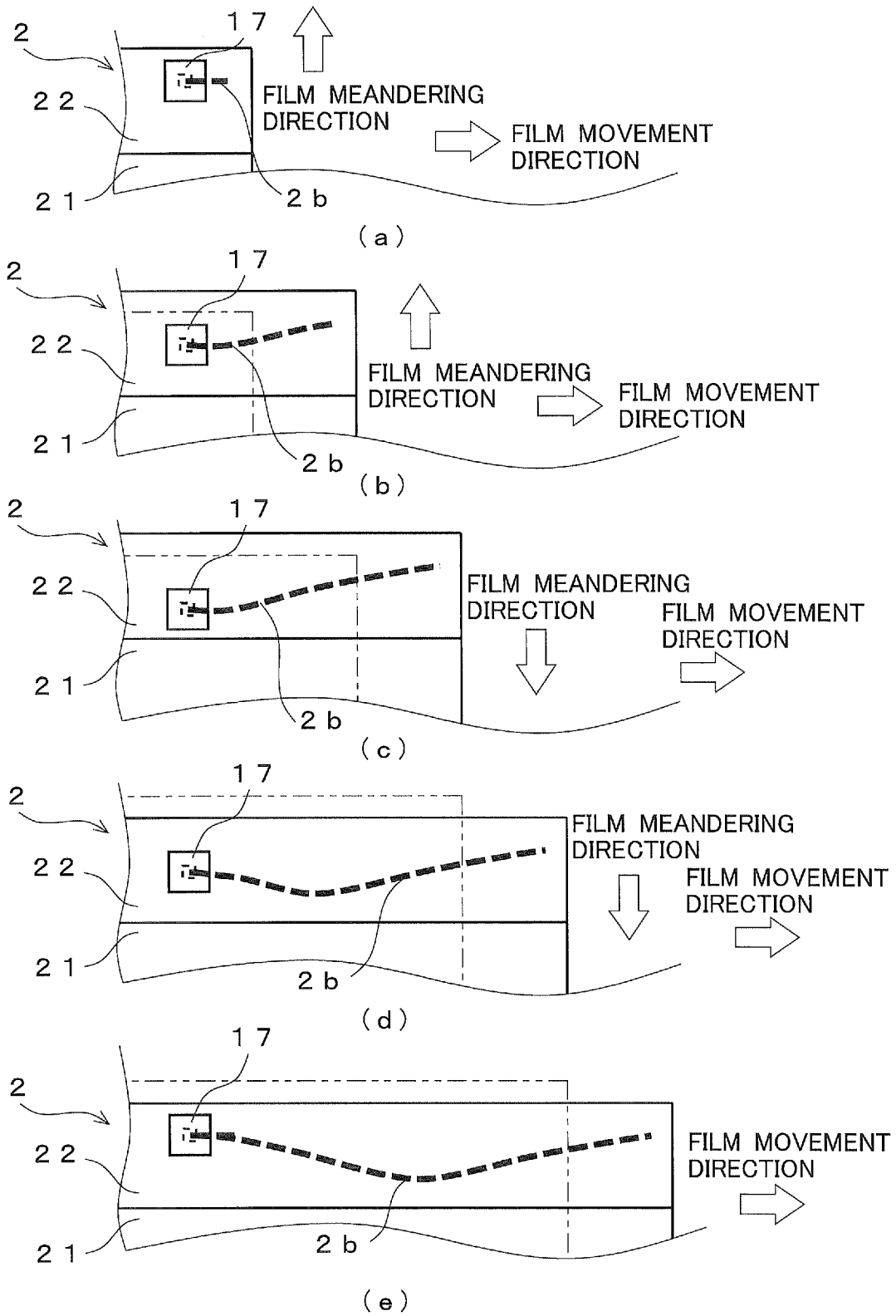
FIGS. 2A to 2E are drawings illustrating meandering of a meandering-detection mark.

The line CCD 14 thereby detects in the present embodiment the position of the leading end and the trailing end of each of the marks 2*b* for meandering detection in a direction intersecting the film movement direction in a case where, for example, as illustrated in FIG. 2, the film 2 has meandered in a direction intersecting the movement direction thereof.

Then, on the basis of this detection result, the control apparatus 30 computes the amount of meandering by the mark 2*b* for meandering detection in a direction intersecting the movement direction of the film 2, and corrects the position of the laser marker 13 for alignment, as illustrated in FIG. 3, on the basis of the computation result. In the present embodiment, even in a case where the film 2 has meandered, the alignment mark 2*a* can be formed in a rectilinear fashion with respect to the film 2, because the meandering of the film is detected by the line CCD 14 and the position of the laser marker 13 for alignment is corrected so as to negate the meandering of the film 2. The formation error is thereby extremely small in the present embodiment in comparison to a case where the alignment mark 2*a* is formed so as to meander in a relative fashion with respect to the film 2.

In the present embodiment, for example, a firing material, a light-curing material, an ink, or the like may be applied in a liquid or paste state to a side part of the film, e.g., a region used in film feeding or the like, to form a side part applied coating 22. A material that can form a firing coating on the film base material 20 by being fired (baked), e.g., a red, green, blue, and/or black resist material for a generic optical color filter can be suitably used as a firing material serving as the side part applied coating 22. However, the side part applied coating in the present invention is to be used only to form the alignment marks for detecting film meandering, and therefore a step such as developing is not especially required in a case where the side part applied coating is formed by a resist material. It would also be possible to use, for example, a curable resin as the light-curing material. Alternatively, in a case where an ink is applied to the material of the side part applied coating 22, a liquid or paste of ink in general containing a pigment and/or dye or the like can be used; an ink that can form a coating once a solvent component has been volatilized by the drying apparatus 5, e.g., an oil-based ink can be suitably used. In a case where the side part applied coating 22 is formed of a firing material or a light-curing material, the firing material or light-curing material may be applied simultaneously with the exposure by using the slit coater 4 for exposure material applicant, or may be applied by another slit coater. In a case where the side part applied coating 22 is formed of an ink, the ink is applied to the side part of the film base material 20 by an application apparatus provided on the upstream side or downstream side of the slit coater 4 in the movement direction of the film 2, i.e., further upstream than the drying apparatus 5. The application apparatus used should be, for example, adapted to apply a coating of ink by causing the ink to permeate an application unit formed of an adequately flexible substance, e.g., felt-quality fibers or the like, and bringing the application unit into contact with a region of the side part of the film base material 20 being fed where the exposure material is not applied.

Preferably, the baking material, light-curing material, or ink is a colored material. That is, a side part applied coating 22 formed of a colored light-curing material or resist material for a color filter has, for example, an absorptivity of 90 to 98% to laser light when irradiated with laser light of a wavelength of 532 nm, a much higher absorptivity than those of the film base material and the oriented coating material (both the film base material and the oriented coating material have an absorptivity of substantially 0% to laser light), and is readily marked by exposure or laser processing using irradiation with the laser light from the laser markers 13, 17. Accordingly, marking by laser light is easier in comparison to a case where a colorless, translucent film base material is marked by being irradiated with laser light, and the alignment mark 2*a* and mark 2*b* for meandering detection are readily formed. For example, in a case where the film base material is being marked, it would be difficult to form the marks 2a, 2b when the irradiation energy of the laser light is not extremely large, for example, 8 J/cm², in a case where, for example, the laser light being used is ultraviolet light of a wavelength of 266 nm. In a case where the oriented material coating is being laser-marked, although the laser light can be given a lower irradiation energy in comparison to the case of only the film base material, the oriented material coating around the marks 2a, 2b is also colorless and translucent, and thus it would be necessary to use, for example, a detection apparatus such as a scanning electron microscope (SEM), and the exposure apparatus would be somewhat costlier and somewhat larger. However, in a case where the side part applied coating 22 is formed of, for example, a colored ink, the laser light can be given a lower irradiation energy, to about 0.6 J/cm², in a case where, for example, the laser light being used is ultraviolet light of a wavelength of 532 nm. Also, in a case where, for example, the side part applied coating 22 is formed of a resist material for a color filter, the laser light can be given a lower irradiation energy, to about 1.0 J/cm². Accordingly, forming the side part applied coating 22 of a colored material as described above makes it easier to mark by laser light and, because the colored application coating remains around the marks thus formed, the alignment mark 2a and the mark 2b for meandering detection thus formed can be readily and accurately detected even in a case where an inexpensive, small-sized detection apparatus such as a CCD camera is used. As such, the meandering of the film 2 according to the mark 2b for meandering detection can be accurately detected, and the alignment mark 2a makes it possible to accurately adjust the masks 12, so the film can be stably exposed.

The following describes the operation of the exposure apparatus of the present embodiment. First, the film 2, before being supplied to the exposure apparatus 1, receives an application of the exposure material serving as the oriented coating (the exposure material coating 21) at the middle of the film base material 20, by the slit coater 4 illustrated in FIG. 9. In a case where the side part applied coating 22 is formed at the side part of the film 2, the firing material or the light-curing material is also applied as the material therefor. Alternatively, in a case where an ink is applied as the material for the side part applied coating 22, the ink is applied to at least one of the two side edges of the film base material (a region up to 25 mm from the edge) by an application apparatus provided to the upstream side or the downstream side of the slit coater 4 in the movement direction of the film (the upstream side of the drying apparatus 5). In the application of the ink, the application unit formed of, for example, a felt-quality fiber or the like, having been permeated by the ink, is brought into contact with the surface of the film base material 20, whereby a coating of the ink is applied to the surface of the film base material 20. A coating of the liquid or paste exposure material and of the resist material, light-curing material, or ink serving as the side part applied coating 22 is thereby applied to the surface of the film base material 20. The materials serving as the side part applied coating 22 are, for example, colored materials.

Next, the film 2 is conveyed to the drying apparatus 5, and the liquid or paste exposure material on the surface is dried. In a case where the material serving as the applied coating is applied to the side part of the film 2, the materials are also dried (volatilization of the solvent component), light-cured, and/or fired (baked) in the drying apparatus 5. The exposure material coating 21 (oriented material coating) and the side part applied coating 22 (resist coating) are thereby formed on the surface of the film base material. That is, the predetermined oriented material coating is formed at the widthwise middle of the film base material, and in a case where the side part applied coating 22 is to be formed at the side part until 25 mm from the edge of the film base material, then the material coating by resist, light-curing material, or ink for forming the alignment mark and the meandering-detection mark is formed at the side parts of the film 2. The film 2 on which one or two of these types of material coating has been formed is then supplied by, for example, the conveyance roller 9 to inside the exposure apparatus 1 from the leading end thereof.

Having been supplied to the exposure apparatus 1, the side parts of the film 2 arrive below the laser marker 17, due to having been conveyed by the conveyance roller or the like. After arriving below the laser marker 17, the side part of the film 2 is irradiated with laser light from the laser marker 17, whereby the formation of the mark 2b for meandering detection is started. Herein, a case where the side part applied coating 22 of the resist coating or the like has been formed at the side parts of the film 2 is preferable because the marking by irradiation with laser light proceeds readily, and the mark 2b for meandering detection, too, is formed distinctly and accurately, and thus detection in subsequent steps is also easier. Although the mark 2b for meandering detection is formed on the film base material by irradiation with laser light, this is not a problem because the side part of the film 2 has conventionally been a region used in, for example, feeding of the film 2 and the like, and is a region not used for an image display region for a display apparatus.

The mark 2b for meandering detection having been formed thereon, the film 2 arrives by conveyance below the line CCD 14 for detecting the position of the mark 2b for meandering detection, but while the film is being conveyed, the film 2 in some cases may meander in a direction perpendicular to the movement direction thereof, solely on the downstream side in the movement direction, as illustrated in FIG. 2, due to, for example, the spacing between the rollers 80, 81 of the conveying apparatus and the roll of film, an error in the take-up of the film into the roll, or the like. The meandering to the downstream side in the movement direction of the film 2 gradually transfers toward the upstream side. In the present embodiment, the position of the mark 2b for meandering detection in a direction intersecting the movement direction of the film 2 is detected at, for example, an index position by the line CCD 14 arranged so as to extend in a direction perpendicular to the movement direction of the film 2, and the control apparatus 30 corrects the position of the laser marker 13 for alignment by using the detection signal. That is, in a case where the mark 2b for meandering detection has meandered upward in FIG. 2, the control apparatus 30 corrects the position of the laser marker 13 for alignment upwardly in FIG. 2 so as to negate the amount of meandering. Irradiation with the laser light from the laser marker 13 for alignment then starts the formation of the alignment mark 2a. Herein, a case where the side part applied coating 22 of the resist coating or the like has been formed at the side parts of the film 2 is preferable because the marking by irradiation with laser light proceeds readily, and the alignment mark 2a, too, is formed distinctly and accurately, and thus detection in subsequent steps is also easier. Although the alignment mark 2a is formed on the film base material by irradiation with laser light, this is not a problem because the side part of the film 2 has conventionally been a region used in, for example, feeding of the film 2 and the like, and is a region not used for an image display region for a display apparatus. The alignment mark 2a is thereby formed rectilinearly in a relative fashion with respect to the film 2, as illustrated in FIG. 2.

During the process of detecting the mark 2b for meandering detection by the line CCD 14, for example, the line CCD 14 detects the positions of the leading end and the trailing end of each of the marks 2b for meandering detection, to serve as indices, in a direction intersecting the film movement direction, as illustrated in FIG. 5. At this time, depending on the arrangement of the mark 2b for meandering detection, in some cases a section where measurement using the line CCD 14 is not possible may be present. However, as illustrated in, for example, FIG. 4A, it is preferable for two rows of the mark 2b for meandering detection to be arranged staggered with each other and for the leading end and trailing end of each of the strip-shaped marks 2b for meandering detection in the two rows to be formed so as to overlap with each other when seen in a direction intersecting the movement direction of the film 2, because the section where measurement of the mark 2b for meandering detection by the line CCD 14 is not possible is eliminated, and the detection accuracy for the position of the mark 2b for meandering detection is heightened.

Figure 8:
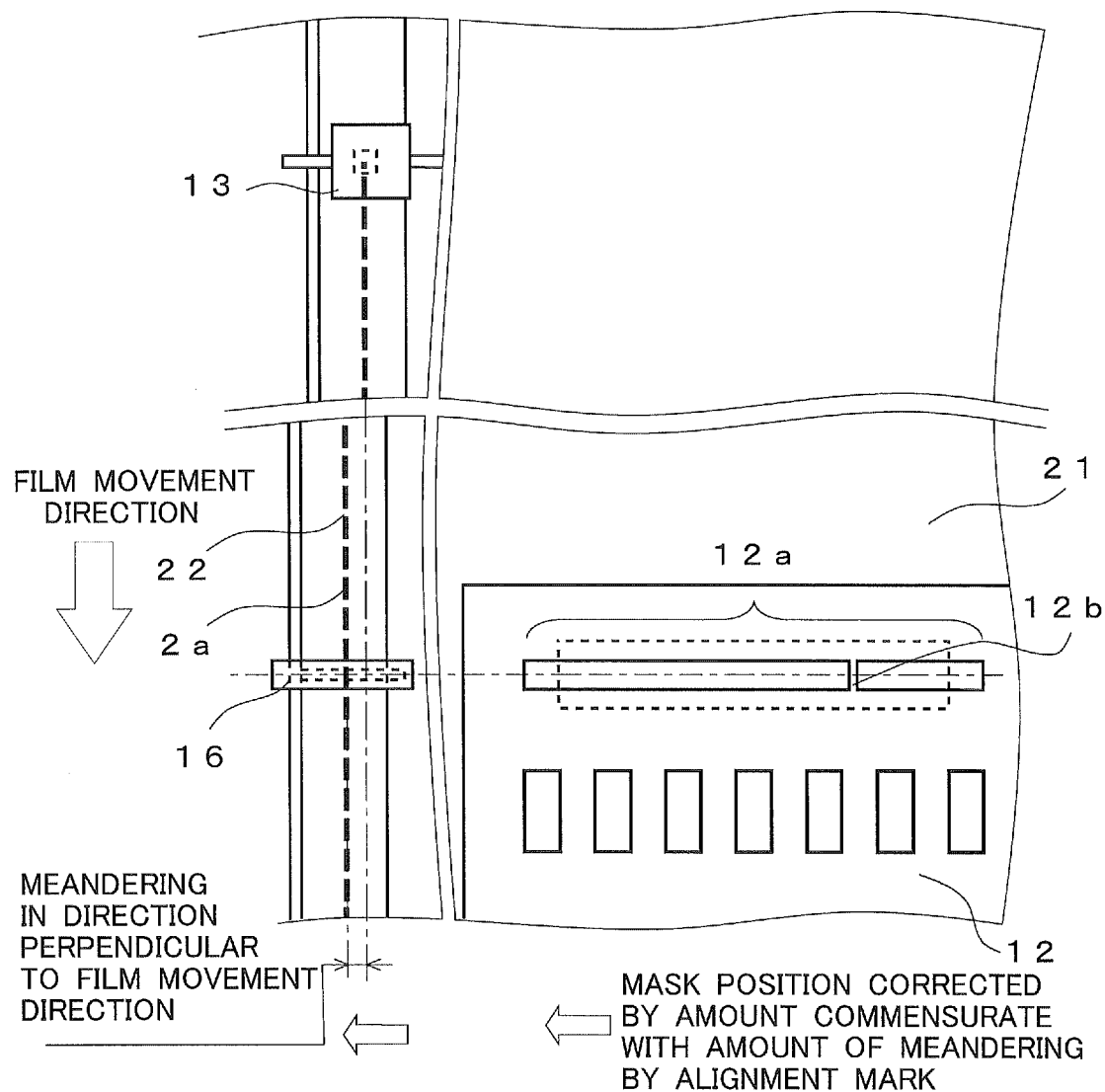
FIG. 8 is a drawing illustrating correction of the mask position by an exposure apparatus as in an embodiment of the present invention.

The alignment mark 2a having been formed rectilinearly in a relative fashion with respect to the film 2, the film 2 is eventually conveyed below the upstream mask 12 (121). As illustrated in FIG. 8, the film 2 may in some cases meander in a direction perpendicular to the movement direction of the film 2 while being conveyed below the masks, but in the present embodiment, a configuration for correcting for this meandering is provided. That is, the line CCD 15 is arranged at a position corresponding to the viewing window 12a and the light-blocking pattern 12b of the masks so as to extend in the width direction of the film 2, and the line CCD 15 detects the position of the light-blocking pattern 12b provided to the middle of the viewing window 12a of the masks 12 as the position of the masks 12. The line CCDs 16 for detecting the alignment mark are provided to positions corresponding to the viewing windows 12a (and the light-blocking pattern 12b) of the masks 12 in the movement direction of the film 2, and detect the alignment mark 2a formed at the side part of the film 2. The signals for the respective mask positions and alignment mark signals detected by the line CCDs 15, 16 are sent to the control apparatus 30 and undergo processing by each of the image processing units (the second image processing unit 32 and the third image processing unit 33), the computation unit 34, the control unit 39, and the like, following which the mask stage is driven by control by the mask stage drive control unit 38, thus making it possible to adjust the mask position using as a reference the position of the alignment mark 2a. That is, in the present embodiment, the alignment mark 2a is formed rectilinearly in a relative fashion with respect to the film 2, but correcting the mask position using the position of the alignment mark 2a as a reference heightens the accuracy for setting the mask position substantially without any detection error being added to the formation error for the alignment mark, even in a case where, for example, the CCD camera or other detection unit for adjusting the mask position has a detection error due to individual differences.

The film 2 then arrives below the patterns 125a of the masks 12. At this time, the oriented coating material (exposure material coating 21) on the surface of the film 2 is oriented in a predetermined direction by being irradiated with the exposure light, which is emitted from the exposure light sources and transmitted through the patterns 125a of the masks 12. The exposure pattern is thereby formed on the film 2. The film 2 is continuously conveyed while continuous light is being emitted from the exposure light sources 11, whereby the exposure pattern is formed on the film 2 so as to extend in a strip shape along the movement direction of the film. In the present embodiment, the meandering of the film 2 can be continuously corrected for and the alignment mark 2a can be formed rectilinearly in a relative fashion even in a case where the film 2 is continuously exposed; moreover, the alignment mark 2a can be used to accurately adjust the position of the masks 12, and therefore the oriented coating material (the exposure material coating 21) can be highly accurately and stably exposed continuously even in a case where the film 2 is supplied continuously.

In the present embodiment, the mask 123 is arranged also on the downstream side in the movement direction of the film and, as illustrated in FIG. 1, the film 2 having been exposed by the upstream mask 121 eventually arrives below the downstream mask 123. In the present embodiment, for example, the region for exposure by the upstream mask 121 and the region for exposure by the downstream mask 123 are formed so as to be adjacent to each other, but as stated above, the position of the downstream mask 123 is adjusted using as a reference the alignment mark 2a having been formed rectilinearly in a relative fashion with respect to the film 2, and thus the accuracy for setting the mask position is high. Accordingly, the regions for exposure by each of the masks can be formed at high accuracy so as to be adjacent without the region exposed by the upstream mask 121 being also exposed by the downstream mask 123 and without the occurrence of an unexposed region.

INDUSTRIAL APPLICABILITY

In the present invention, in an exposure apparatus for continuously exposing a member to be exposed being conveyed continuously, a meandering-detection mark is formed further downstream than an irradiation position for exposure light for the member to be exposed, the position of the meandering-detection mark is detected to compute the amount of meandering, and an alignment mark for adjusting the mask position is formed so as to negate the amount of meandering, and thus the alignment mark can be formed rectilinearly in a relative fashion with respect to the member to be exposed, and even in a case where the member to be exposed has meandered in a direction perpendicular to the movement direction thereof, the mask position can still be accurately adjusted; therefore, the present invention enables the achievement of stably high-accuracy continuous exposure, and is highly valuable in terms of industrial applicability.

KEY 1, 10: exposure apparatus
12: mask
12a: viewing window
12b: light-blocking pattern
120: frame body
121: (first) mask
122: (second) mask
123: (third) mask
124: (fourth) mask
125: pattern formation unit
125a: (mask) pattern
13: laser marker for alignment
14: line CCD (for detecting the position of the meandering-detection mark)
15: line CCD (for detecting the mask position)
16: line CCD (for alignment mark detection)
17: laser marker
2: film
2a: alignment mar 2b: meandering-detection mark
20: member to be exposed
21: exposure material coating
22: side part application coating
30: control apparatus
31: first image processing unit
32: second image processing unit
33: third image processing unit
34: computation unit
35: memory
36: motor drive control unit
37: laser marker drive control unit
38: mask stage drive control unit
39: control unit
100: region corresponding to image display region

The invention claimed is:

1. An exposure apparatus for causing an exposure pattern formation region of a member to be exposed continuously conveyed by a conveying apparatus to be irradiated, via masks, with an exposure light emitted from an exposure light source, whereby said exposure pattern formation region is exposed to a mask pattern corresponding to each of said masks, the exposure apparatus comprising:
a first mark-forming unit for forming a meandering-detection mark on said member to be exposed, the first mark-forming unit being arranged further upstream than an irradiation position for said exposure light in a direction of movement of said member to be exposed;
a first detection unit for detecting a position of said meandering-detection mark in a direction intersecting the direction of movement of said member to be exposed, the first detection unit being arranged between said first mark-forming unit and the irradiation position for said exposure light in the direction of movement of said member to be exposed;
a first meandering computation unit for computing an amount of meandering by said meandering-detection mark on the basis of the position of said meandering-detection mark as detected by the first detection unit;
a second mark-forming unit for forming an alignment mark for adjusting a position of said masks, the second mark-forming unit being arranged so as to be capable of moving in a direction perpendicular to the direction of movement of said member to be exposed, at a position corresponding to a position of said first detection unit in the direction of movement of said member to be exposed; and
a first control unit for moving said second mark-forming unit so as to negate the amount of meandering by said meandering-detection mark as found by said first meandering computation unit.

2. The exposure apparatus as set forth in claim 1, comprising:
a second detection unit for detecting a position of said alignment mark in a direction intersecting the direction of movement of said member to be exposed, the second detection unit being arranged on a downstream side of said second mark-forming unit in the direction of movement of said member to be exposed;
a second meandering computation unit for computing an amount of meandering by said alignment mark on the basis of the position of said alignment mark at said index position as detected by said second detection unit; and
a second control unit for adjusting the positions of said masks in a direction perpendicular to the direction of movement of said member to be exposed in accordance with the amount of meandering by said alignment mark as found by the second meandering computation unit.

3. The exposure apparatus as set forth in claim 2, wherein,
a plurality of said masks is arranged spaced apart in the direction of movement of said member to be exposed, and said second meandering computation unit and said second control unit are provided correspondingly with respect to each of said masks.

4. The exposure apparatus as set forth in claim 3, wherein, said second mark-forming unit continuously or intermittently forms the alignment mark on said member to be exposed in the direction of movement of said member to be exposed.

5. The exposure apparatus as set forth in claim 3, wherein, said first mark-forming unit is adapted for forming on said member to be exposed the mark for meandering direction, by which an intermittent index is imparted in the direction of movement of said member to be exposed; and said first detection unit is adapted for detecting the position of said meandering-detection mark at said index position in a direction intersecting the direction of movement of said member to be exposed.

6. The exposure apparatus as set forth in claim 2, wherein, said second mark-forming unit continuously or intermittently forms the alignment mark on said member to be exposed in the direction of movement of said member to be exposed.

7. The exposure apparatus as set forth in claim 2, wherein, said first mark-forming unit is adapted for forming on said member to be exposed the mark for meandering direction, by which an intermittent index is imparted in the direction of movement of said member to be exposed; and said first detection unit is adapted for detecting the position of said meandering-detection mark at said index position in a direction intersecting the direction of movement of said member to be exposed.

8. The exposure apparatus as set forth in claim 1, wherein, said second mark-forming unit continuously or intermittently forms the alignment mark on said member to be exposed in the direction of movement of said member to be exposed.

9. The exposure apparatus as set forth in claim 8, wherein, said first mark-forming unit is adapted for forming on said member to be exposed the mark for meandering direction, by which an intermittent index is imparted in the direction of movement of said member to be exposed; and said first detection unit is adapted for detecting the position of said meandering-detection mark at said index position in a direction intersecting the direction of movement of said member to be exposed.

10. The exposure apparatus as set forth in claim 1, wherein, said first mark-forming unit is adapted for forming on said member to be exposed the mark for meandering direction, by which an intermittent index is imparted in the direction of movement of said member to be exposed; and said first detection unit is adapted for detecting the position of said meandering-detection mark at said index position in a direction intersecting the direction of movement of said member to be exposed.

* * * * *